(12) United States Patent
Engh et al.

(10) Patent No.: US 6,301,151 B1
(45) Date of Patent: Oct. 9, 2001

(54) ADAPTIVE PROGRAMMING METHOD AND APPARATUS FOR FLASH MEMORY ANALOG STORAGE

(75) Inventors: Lawrence D. Engh, Redwood City; Albert V. Kordesch, San Jose; Ping Guo, Campbell; Chun-Mai Liu, San Jose, all of CA (US)

(73) Assignee: Information Storage Devices, Inc., San Jose, CA (US)

( * ) Notice: Subject to any disclaimer, the term of this patent is extended or adjusted under 35 U.S.C. 154(b) by 0 days.

(21) Appl. No.: 09/634,180

(22) Filed: Aug. 9, 2000

(51) Int. Cl.[7] ................................................ G11C 7/00
(52) U.S. Cl. ................................ 365/185.03; 365/185.18
(58) Field of Search ........................ 365/185.03, 185.18, 365/185.23

(56) References Cited

U.S. PATENT DOCUMENTS

| | | | |
|---|---|---|---|
| 5,220,531 | 6/1993 | Blyth et al. | 365/189.07 |
| 5,623,436 | 4/1997 | Sowards et al. | 365/45 |
| 5,629,890 | 5/1997 | Engh | 365/185.03 |
| 5,754,470 | 5/1998 | Engh et al. | 365/185.03 |
| 5,877,984 | 3/1999 | Engh | 365/185.19 |
| 5,926,409 | 7/1999 | Engh et al. | 365/45 |
| 5,959,883 | * 9/1999 | Brennan et al. | 365/185.03 |
| 5,963,462 | 10/1999 | Engh et al. | 365/45 |
| 6,040,993 | * 3/2000 | Chen et al. | 365/185.03 |
| 6,046,934 | * 4/2000 | Lin | 365/185.03 |
| 6,134,141 | * 10/2000 | Wonh | 365/185.03 |
| 6,175,937 | * 1/2001 | Norman et al. | 365/185.03 |

* cited by examiner

Primary Examiner—Son T. Dinh
(74) Attorney, Agent, or Firm—Blakely, Sokoloff, Taylor & Zafman LLP

(57) ABSTRACT

Adaptive programming method and apparatus for flash memory analog storage. The present invention method is to adjust the voltage of the programming pulse each time based on the result of the previous pulse. The expected change in the programmed value is compared to the measured change, and the difference used to improve the model of that cell after each programming pulse. The algorithm is "adaptive" because the voltage of each pulse is adapted to whatever the cell needs. If the cell is programming too slowly, the voltage is increased dramatically to make it faster. Conversely if the results show that a particular cell is programming too fast, the next voltage pulse is increased by only a small amount (or even decreased if necessary). Because the response of the cell is non-linear, a special analog circuit is used to calculate the optimum voltage for each pulse. As one alternative, a digital calculation may also be used to program the cells. Because of the programming speed of the exemplary method, a voice signal may be sampled and stored in flash memory one cell at a time. Variable programming parameters other than voltage may be used if desired.

25 Claims, 3 Drawing Sheets

Eight Pulses, 10 μs Each

Adaptive Algorithm

ADAPTIVE PROGRAMMING METHOD AND APPARATUS FOR FLASH MEMORY ANALOG STORAGE

BACKGROUND OF THE INVENTION

1. Field of the Invention

The present invention relates to the field of analog signal storage.

2. Prior Art

Existing multi-level analog non-volatile flash memory storage solutions use a long sequence of programming pulses to program the flash memory cells. Each successive pulse has a slightly higher voltage than the last (like a voltage staircase). After each programming pulse, the state of the flash memory cell is measured and compared to the input voltage Depending on the result of the comparison, another program pulse will be generated or the programming will stop. Such a system has to use at least the same number of pulses as the desired number of levels to be stored in the memory cell. For example, to program a cell to the $256^{th}$ level will require at least 256 pulses. In order to achieve the required system speed, multiple cells have to be programmed in parallel. This requires a large number of circuits, one for each cell. These circuits and their supporting circuits consume a significant amount of area and power.

For analog signal recording and playback utilizing non-volatile memory integrated circuits, as described in U.S. Pat. No. 5,220,531 by Trevor Blyth and Richard Simko, EEPROM (electrically erasable programmable read only memory) cells are used. The programming pulse is divided into a series of coarse pulses and a series of fine pulses to reduce the total number of pulses required. This method still requires a large number of pulses and many cells have to be programmed in parallel.

Another solution is U.S. Pat. No. 5,959,883 by Peter Holzmann, et al. entitled "Recording and Playback Integrated System for Analog Non-volatile Flash Memory." This method also uses coarse and fine pulses, and still requires many pulses and many cells to be programmed in parallel.

In U.S. Pat. No. 5,963,462 by Larry Engh, et al. "Integrated Circuit System for Analog Signal Storing and Recovery Incorporating Read While Writing Voltage Program Method" (1999), a method is described to program a single cell using "read-while-writing" operations. This requires only two or three pulses, but the method applies to EEPROM memory and cannot be applied to flash memory.

BRIEF SUMMARY OF THE INVENTION

Adaptive programming method and apparatus for flash memory analog storage. The present invention method is to adjust the voltage of the programming pulse each time based on the result of the previous pulse. The expected change in the programmed value is compared to the measured change, and the difference used to improve the model of that cell after each programming pulse. The algorithm is "adaptive" because the voltage of each pulse is adapted to whatever the cell needs. If the cell is programming too slowly, the voltage is increased dramatically to make it faster. Conversely if the results show that a particular cell is programming too fast, the next voltage pulse is increased by only a small amount (or even decreased if necessary). Because the response of the cell is non-linear, a special analog circuit is used to calculate the optimum voltage for each pulse. As one alternative, a digital calculation may also be used to program the cells. Because of the programming speed of the exemplary method, a voice signal may be sampled and stored in flash memory one cell at a time. Variable programming parameters other than voltage may be used if desired.

DETAILED DESCRIPTION OF THE PREFERRED EMBODIMENT

Figure 1:
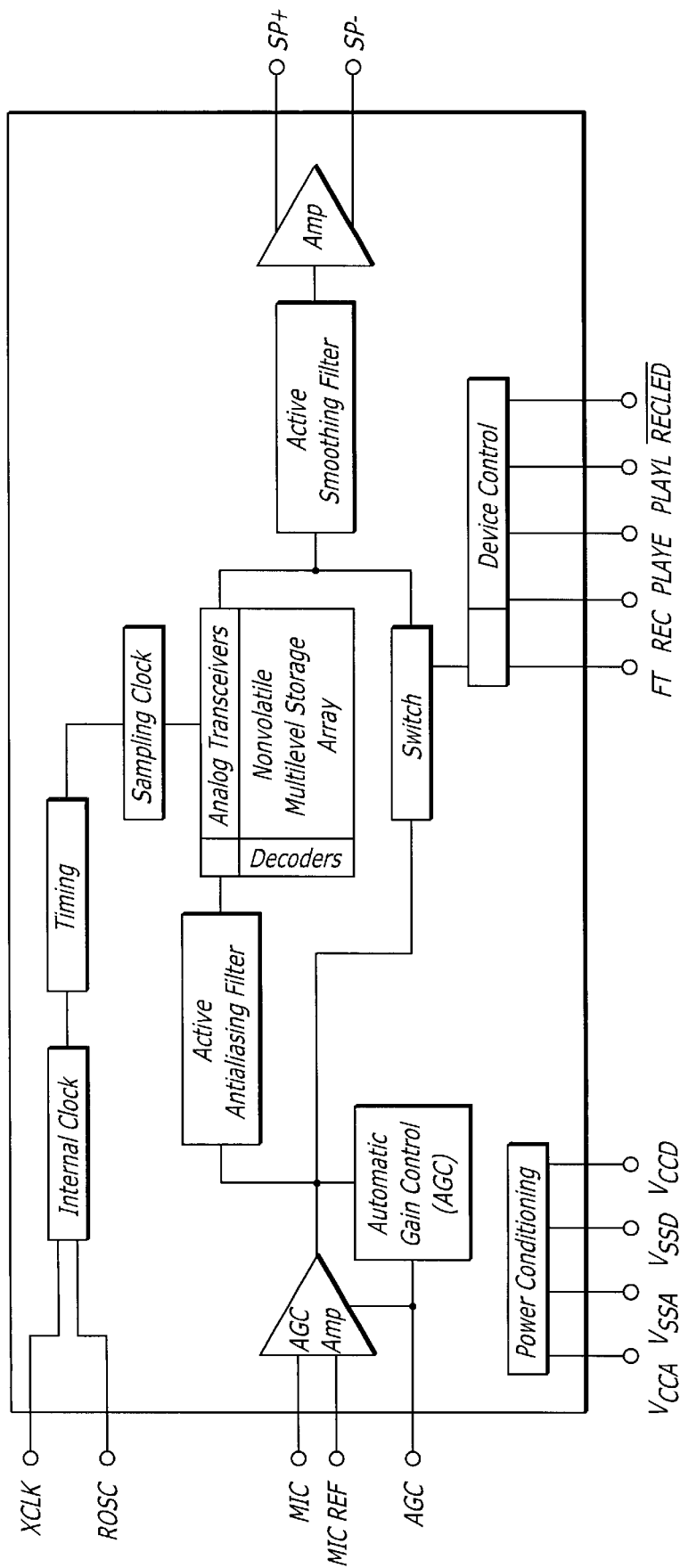
FIG. 1 is a representative block diagram of an analog sample storage system in which the present invention may be used.

The exemplary embodiments of the present invention are used in conjunction with the storage of analog information in non-volatile memory. A typical application of the embodiments is for the storage of voice into an array of cells by sampling the analog input signal at a fixed rate and using each cell to store one sample. To restore the signal, the cells are read at the same rate to reconstruct the original analog input signal. The input signal at any time could also represent digital information encoded as one of a predetermined multiple of voltage levels. A representative block diagram of such an analog sample storage system is presented in FIG. 1.

For analog storage in the exemplary embodiments, cells are read in a source follower configuration, as described in U.S. Pat. No. 5,220,531 entitled "Source Follower Storage Cell and Improved Method and Apparatus for Iterative Write for Integrated Circuit Analog Signal Recording and Playback", the disclosure of which is hereby incorporated herein by reference. This configuration gives excellent performance for analog storage. The integrated circuit systems that this invention is intended for are similar to that described in U.S. Pat. No. 5,959,883 entitled "Recording and Playback Integrated System for Analog Non-volatile Flash Memory", the disclosure of which is also hereby incorporated herein by reference. The present invention is an improvement in the analog storage method used in these prior devices.

The invention is an iterative method of programming FLASH non-volatile memory cells to a nearly exact value by adjusting the voltage of each programming pulse based upon the result of the previous pulse. The expected change in the programmed value is compared to the measured change, and the difference used to improve the model of that cell after each programming pulse. The method is "adaptive" because the voltage of each pulse is adapted to whatever each cell needs. If the cell is programming too slowly, the voltage is increased dramatically to make it program faster. Conversely, if the results show that a particular cell is programming too fast, the next voltage pulse is increased by only a small amount (or even decreased if necessary). Because the response of the cell is non-linear, the exemplary integrated circuit uses a non-linear analog circuit to calculate the optimum voltage for each pulse. For an alternate digital embodiment, a log function may be calculated. A digital embodiment may also be used in an integrated circuit system.

Figure 2:
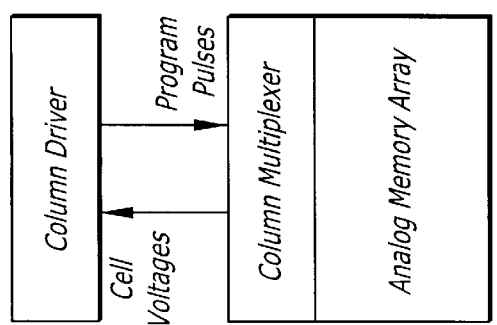
FIG. 2 is a block diagram of a portion of an integrated circuit embodiment of the invention comprised of a column driver and a memory array with multiplexers.

The integrated circuit embodiment of the invention is comprised of a column driver and a memory array with multiplexers, as illustrated in the block diagram of FIG. 2. The column driver comprises a counter, a read circuit, an analog circuit for calculating the pulse height, and amplifiers, capacitors and switches. The column driver reads a cell voltage in the memory array and then the voltage of the next programming pulse is calculated. The new voltage pulse is applied to the cell, and the column driver pulses a controlled current to the cell for a controlled period of time while the new voltage pulse is held constant.

A novel form of equation is used in analog or digital circuitry to calculate the next voltage pulse for programming the FLASH memory cell. This equation models the performance of the programming with enough accuracy that high quality analog voice recording can be stored into an array of FLASH cells in real time using a single column driver. The embodiment specifically disclosed herein maintains the current and the time used for the programming pulse constant. However, instead of or in addition to voltage variations, either current or time variations or any combinations of the three parameters could also be used to adjust the programming increment of the memory cells. However in the exemplary embodiment, voltage was chosen because it was the most convenient variable to control. When only voltage is used as a variable, then the product of the program current multiplied by the program time is kept constant. In the exemplary embodiments, where voltage is the programming variable, when the programming voltage to be used for any particular pulse is set, then a current pulse of a fixed value and time is applied to do the programming. In that regard, it is to be understood that programming only occurs when all required programming conditions are set, typically requiring the establishment of more than one programming parameter, even though only one of those parameters (and/or the length of time all such parameters are established and held) might be varied to control the amount of programming to be achieved. Thus the phrases "voltage pulse" and "programming voltage pulse" as used herein and in the claims relates to the variable selected for programming the cells, even though that programming may only occur during a shorter pulse of some other required parameter (current in the exemplary embodiment) within the period of the "voltage pulse" or "programming voltage pulse".

In the exemplary embodiment, repeated sequences of (1), read the cell to determine the cell read voltage, (2), make certain calculations to determine the voltage of the next programming pulse to be applied, and (3), apply the programming pulse of (2). The equation used to calculate each programming pulse voltage $V_{pulse(N)}$ in the exemplary embodiment is:

$$V_{pulse(N)}=0.77*[\log_{10}(\Delta V_{sf(N)})+G_{(N)}-3*(V_{sf(N)}-\Delta V_{sf(N)})]$$

Where:

N=the number of the respective read, calculate and pulse sequence described above.

$V_{sf(N)}$=the cell read voltage of the respective read, calculate and pulse sequence.

$G_{(N)}$=a value that is an estimate of the "speed" of cell programming of the respective read, calculate and pulse sequence. For the first programming pulse $V_{pulse(1)}$, an initial value $G_{(1)}$ must be guessed at. Each later programming pulse in the exemplary embodiment improves the accuracy of the $G_{(N)}$ term by adjusting its value to more accurately reflect the actual cell programming characteristics as determined by a comparison between the programming expected by the prior programming pulse and the actual programming achieved by the prior programming pulse.

$\Delta V_{sf(N)}$=a calculated value to be described later.

The constants 0.77 and 3 depend upon the process and layout of the cell. Preferably provision is made for all of these constants to be set after integrated circuit fabrication by use of trim bits in the integrated circuit.

Figure 3:
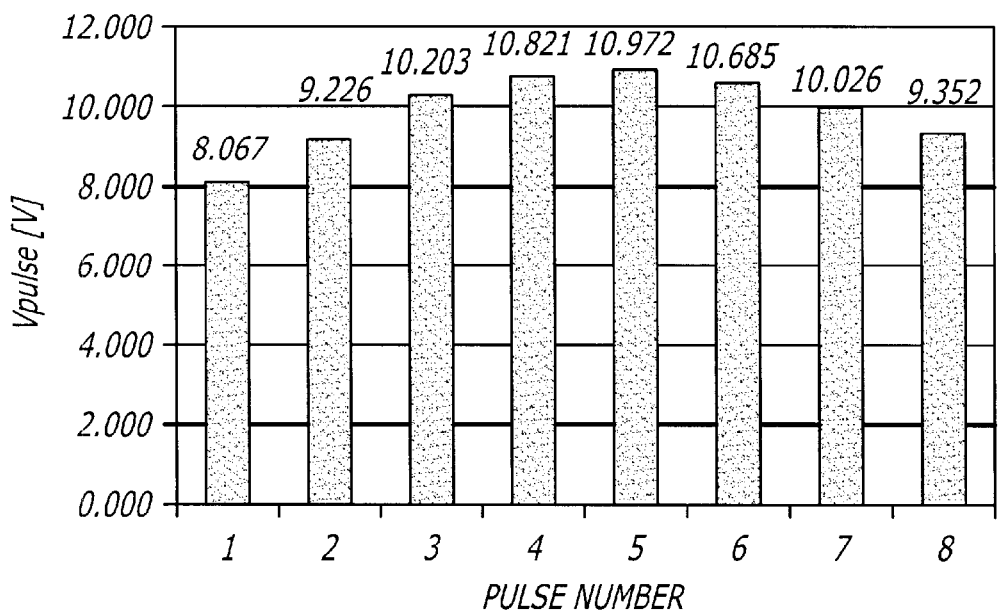
FIG. 3 is a plot entitled "Eight Pulses, 10 $\mu$s Each" showing a typical sequence of programming pulses for the exemplary embodiment.
Figure 4:
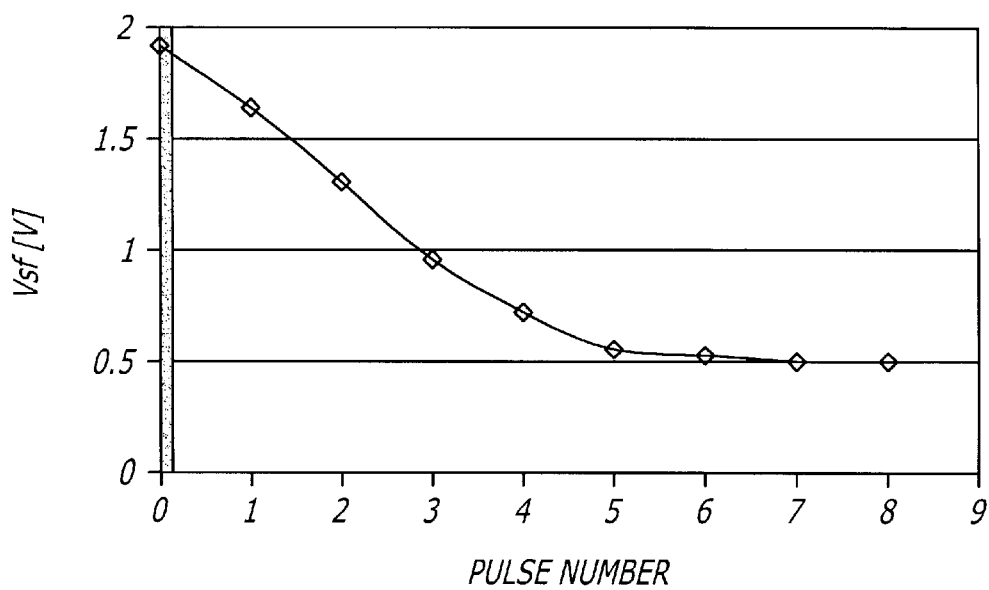
FIG. 4 is a plot entitled "Adaptive Algorithm" showing cell read voltages for the typical sequence of programming pulses for the exemplary embodiment as shown in FIG. 3.

The plot "Eight Pulses, 10 μs Each" of FIG. 3 shows a typical sequence of programming pulses for the exemplary embodiment. The programming voltage starts low and increases to a maximum for the fifth pulse. The cell read voltages are shown in the plot "Adaptive Algorithm" of FIG. 4. After the fifth pulse, the cell read voltage is very close to the exemplary Target voltage of 0.5 volts, after which the program pulses reduce in voltage for the fine adjustment of the cell read voltage $V_{sf(N)}$. In this example the eighth programming pulse is more than one volt lower than the largest programming pulse.

For an accurate final programming of the FLASH cell, care must be taken to prevent over-programming of the cell during early program cycles. Over-programming is prevented by using a small value of $\Delta V_{sf(N)}$ during the first several program cycles. The term $\Delta V_{sf(N)}$ is the change of $V_{sf}$ calculated to occur during the next programming pulse. If $\Delta V_{sf(N)}$ is set to the full value of ($V_{sf(N)}$–Target), in theory the cell could be fully programmed in a single pulse. In practice however, given the normal variations encountered, the cell would often be over-programmed. If $\Delta V_{sf(N)}$ is set with a constant multiplier, say one half, then the tolerance to cell variations is poorer. After much simulation, the following formula with a variable multiplier was selected for the exemplary embodiment.

$$\Delta V_{sf(N)}=0.125*N*(V_{sf(N)}-Target)$$

Where as before:

N=the number of the respective read, calculate and pulse sequence, in the exemplary embodiment, 1 to 8.

$V_{sf(N)}$=the cell read voltage before the next programming pulse $V_{pulse(N)}$. Therefore ($V_{sf(N)}$–Target) is the amount or magnitude of the programming left to be done by the Nth and any other remaining programming pulses.

Figure 5:
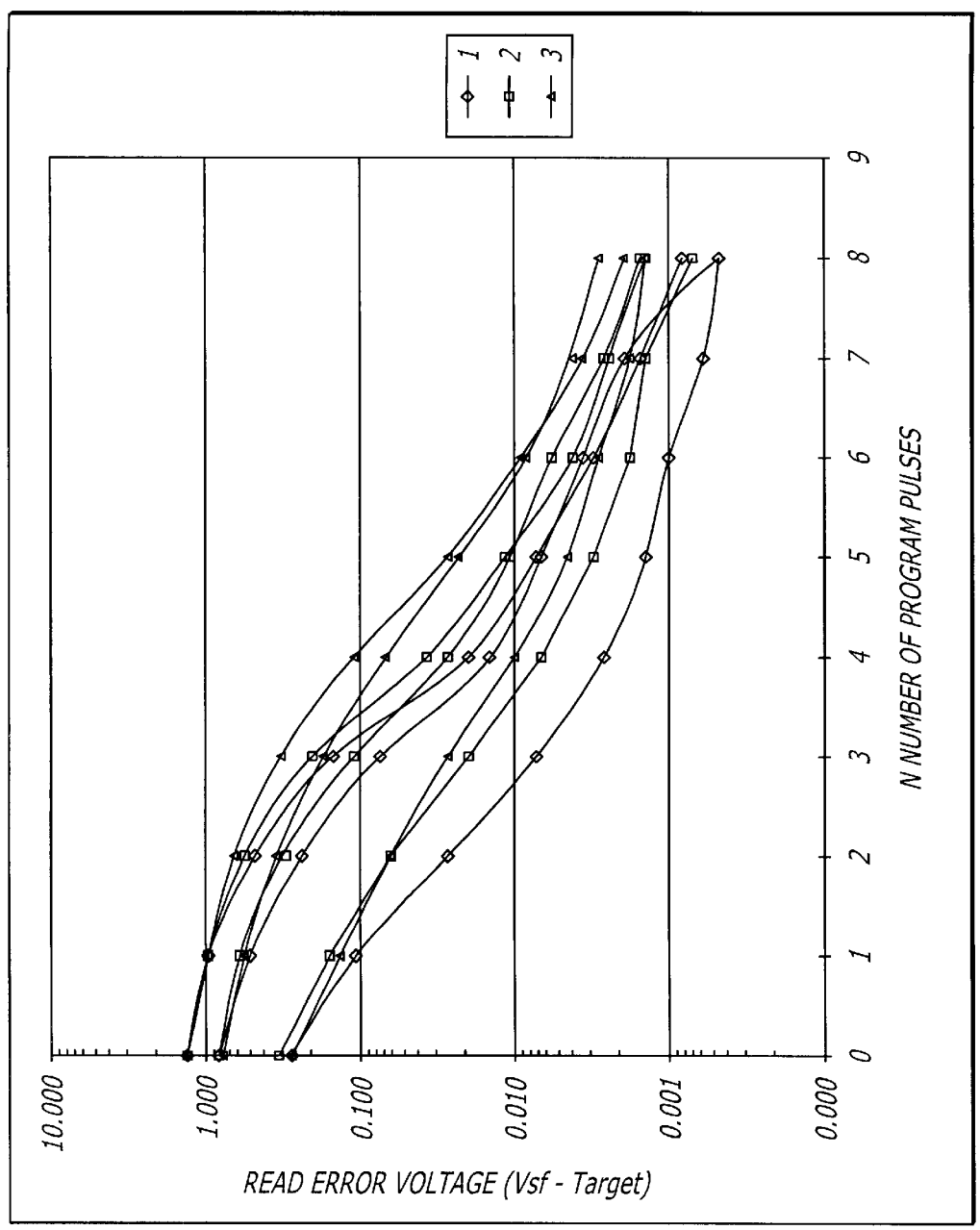
FIG. 5 is a plot entitled "Read Error Voltage vs N Number of Program Pulses for Three Cells and Three Target Voltages".

Note that in the plot of "Read Error Voltage vs N Number of Program Pulses for Three Cells and Three Target Voltages" of FIG. 5, the vertical axis has a log scale, yet the data points form nearly straight lines. This shows that each pulse is contributing to the final accuracy.

In the exemplary embodiment, the term $G_{(N)}$ is incremented after each programming pulse $V_{pulse(N-1)}$ for use for the next programming pulse $V_{pulse(N)}$ in accordance with the prior equation for $V_{pulse(N)}$ by the formula:

$$G_{(N)}=G_{(N-1)}+1.5*((V_{sf(N)}-(V_{sf(N-1)}-\Delta V_{sf(N-1)}))$$

In words, the value of G used to calculate the voltage of the next programming pulse $V_{pulse(N)}$ in the exemplary embodiment is the value of $G_{(N-1)}$ used for the last programming pulse $V_{pulse(N-1)}$, plus 1.5 times the cell read voltage $V_{sf(N)}$ after the last programming pulse $V_{pulse(N-1)}$ minus the cell read voltage expected after the last pulse. The cell read voltage expected after the last pulse is the cell read voltage $V_{sf(N-1)}$ before the last programming pulse $V_{pulse(N-1)}$ minus the calculated change $\Delta V_{sf(N-1)}$ in the cell read voltage which should have occurred as a result of the last programming pulse $V_{pulse(N-1)}$. The adjustment of the $G_{(N)}$ term models the "speed" of the cell. The value of $G_{(N)}$ adapts to the real cell characteristics quickly during the first several pulses and gives a very precise final result. The use of the 1.5 constant was again chosen after extensive simulation of convergence behavior, though like all the other specific parameters set forth herein, is a choice specifically for the exemplary embodiment, and could readily differ from 1.5, particularly using cells of other designs or fabricated using other processes.

The use of eight pulses gives the desired accuracy and good tolerance of process and cell variations. More pulses do not improve the final long-term system accuracy. Fewer pulses give either greater errors or poorer tolerance of variations. The final accuracy in the exemplary embodiment is about 0.003 volt within a useful range of one volt. The individual pulse voltages do not need to be accurate to within 0.003 volt, as the programmed increment per programming voltage increment is less than 1/1, particularly for the later pulses in each programming series (see FIGS. 3 and 4). The fine adjustment of the final memory voltage is controlled by the reduction of the pulse voltage by much larger steps. This very non-linear characteristic is calculated by the $\log_{10}(\Delta V_{sf(N)})$ term of the $V_{pulse(N)}$ equation.

The eight pulse algorithm in a digital implementation has been demonstrated on cells using a digital computer and the following operations:

1. Initialize N=1, $G_{(1)}$=14.6 (selected to prevent over-programming).
2. Read $V_{sf(N)}$.
3. Calculate and turn on the pulse voltage.
   a. $G_{(N)}=G_{(N-1)}+1.5*((V_{sf(N)}-(V_{sf(N-1)}-\Delta V_{sf(N-1)}))$
   b. $\Delta V_{sf(N)}=0.125*N*(V_{sf(N)}-\text{Target})$
   c. $V_{pulse(N)}=0.77*[\log_{10}(\Delta V_{sf(N)})+G-3*(V_{sf(N)}-\Delta V_{sf(N)})]$
4. Pulse the cell current for the set time. (10 μA for 10 μSec.)
5. Increment N (N=N+1)
6. If (N<9), then go to 2.
7. Done.

For an integrated circuit embodiment, some modification was done to the calculation. Since speed of operation is important, the value $\Delta V_{pulse(N)}$ when N>1 is calculated in the analog domain, instead of a complete calculation of $V_{pulse(N)}$. This gives equivalent performance of the algorithm.

A "global" adaptation to provide an additional G term may be used for the first program voltage pulse calculation. This input is calculated from the experience with earlier cells being programmed. For the first cell, this value is set to zero. The change in G term calculated for the second program voltage pulse is added to the "global" G term. This sum term accumulates over many cells to improve the initial program voltage pulse. Use of this "global" adaptation improves process tolerance. Since one major cause of cell variation is poor mask alignment, all of the "up" cells are programmed first. Then all of the "down" cells are programmed with a reset "global" G. (The up and down cells are disposed above and below common diffusion areas in the cells under consideration.) Preferably the adjustment in the global G term made by each cell is small, such as only applying a small part of the difference in G value for each cell or by using an average of many cells for the global G term to avoid a single bad cell forcing the global G value out of a useful range.

As stated before, for a digital calculation, the voltage $V_{sf}$ is measured and then the value of $V_{pulse(N)}$ is calculated. For the integrated circuit, an analog calculation is used. The log function is based upon the "sub-threshold" voltage vs. current of an N-MOS transistor. This circuit operates with enough accuracy over the range needed for the algorithm to converge properly. Deviation from the ideal characteristic produces a tendency to either consistently under-program or over-program. Trim bits in the integrated circuit allow selection of the gain of the log function.

One feature of the invention is a great tolerance for process variations. The tolerance is enough that imperfections in the computation circuit are also well tolerated. The voltage of the individual programming pulses can also contain small errors since these errors will be adapted for. If the process variations may be sufficiently well controlled, one may be able to use the same value of G for all integrated circuits. Otherwise, circuits may need to be individually characterized at one temperature before the unique initial value for each circuit is chosen. The initial value of G is preferably temperature compensated. Because the temperature variation in the programming characteristics are fairly well behaved over the desired temperature range, setting the initial value of G at room temperature and using a predetermined temperature compensation of the initial G value keeps the calculations well centered over the temperature range. Temperature compensation using an analog circuit for the calculations may be done, by way of example, by making the circuit operating characteristics themselves vary with temperature as desired by using a temperature dependent current source or otherwise. Temperature compensation using digital calculations may, by way of example, be done in the digital domain or in the analog domain on either side of the digital circuitry.

The exemplary programming technique may be outlined as follows. First the programming characteristic curve(s) or equation(s) for the parameter or parameters to be used for programming are approximated or modeled. Then the first programming pulse is selected to program the cell in an amount dependent on the amount of programming required by the cell (in the exemplary embodiment, reflected by the calculated value of $\Delta V_{sf(1)}$ used to determine the voltage of the first programming pulse $V_{pulse(1)}$), but using values in the model to purposely under-program the cell to adequately account for cell to cell and/or circuit to circuit variations. Then, reading the cell output before each pulse and doing the appropriate analysis in the analog or digital domain, or partially in each:

1. the amount of programming actually done by the prior programming pulse and the amount of programming expected to be done by the prior programming pulse is used to more accurately set one or more values in the model, and
2. using the model of the cell with the more accurate value(s), each successive programming pulse is adjusted responsive to the amount of programming remaining to be done.

Preferably, as in the exemplary embodiment, the amount of programming remaining to be done is given some weight for the first or early programming pulses, but its weight is much increased for the last or later programming pulses. In the exemplary embodiment, the model is well behaved but one of the values in the model can vary substantially. Right from the first pulse, that value in the exemplary embodiment quickly adapts to the characteristics of the cell being programmed by immediately giving full weight to the difference between the amount of programming actually done by the prior programming pulse and the amount of programming expected to be done by the prior programming pulse when adjusting its value. However, the weight given to the amount of programming remaining to be done for the first programming pulse is only one eighth as the model begins to adapt to the specific cell being programmed, linearly increasing to full weight for the last programming pulse (N=8) when the model now accurately models the specific cell being programmed.

Through this invention, in many applications, no parallel programming (simultaneous programming of a plurality of cells) is required. Only one cell is programmed at a time, with very few (typically eight) pulses. This means that only one programming circuit is required instead of many, reducing the chip area, power and cost of the product. The low cost of the finished product makes applications for the product possible that were considered too expensive with prior art technology.

Thus the novel elements of this invention include one or more of the following aspects:

1. Calculating the next pulse voltage based on the previous result.
2. "Adapting" locally to each cell as it is being programmed.
3. "Adapting" globally for the average speed of many memory cells.
4. Using unique mathematical relationships to model the cells.
5. Using a non-linear analog circuit to do this calculation.
6. Using trim circuits to set the initial guess values.
7. Modeling improvements for each cell after each program pulse.

Advantages of this invention include one or more of the following:

1. The accuracy of the final programmed cell can be much greater than the accuracy of each of the program pulses.
2. The cost of analog FLASH memory is reduced.
   a. The number of program pulses needed for analog Flash memory is reduced.
   b. The time needed to program analog Flash memory is reduced.
   c. The total circuitry needed to program analog Flash memory is reduced.

Thus, while the present invention had been disclosed and described with respect to specific preferred embodiments, it will be understood by those skilled in the art various changes in form and detail may be made therein without departing from the spirit and scope of the invention.

What is claimed is:

1. A method of programming an analog storage memory cell to provide a cell read voltage in accordance with an analog voltage to be stored in the cell comprising:
   (a) selecting a parameter effecting an analog voltage stored in the cell;
   (b) modeling the cell programming characteristics as responsive to that programming parameter;
   (c) applying the programming parameter to the cell using at least one value in the model selected to under-program the cell;
   (d) determining the change in the cell read voltage;
   (e) revising the value(s) in the model to more accurately reflect the actual cell programming characteristics; and,
   (f) again applying the programming parameter to the cell using the revised value(s) in the model.

2. The method of claim 1 further comprising repeating (d), (e) and (f) at least once.

3. The method of claim 2 wherein the modeling of the cell programming characteristics includes at least one value dependent on the amount of cell programming left to be done.

4. The method of claim 3 wherein one of the at least one value in the model selected to under-program the cell is the value dependent on the amount of cell programming left to be done.

5. The method of claim 4 wherein the value dependent on the amount of cell programming left to be done is a value reflecting only a fraction of the amount of cell programming left to be done when applying the first programming parameter to the cell, which fraction is increased when repeating (d), (e) and (f).

6. A method of storing an audio signal in a plurality of flash memory cells to allow reconstructing the audio signal by reading the analog voltages in each cell and successively concatenating the voltages read from the cells comprising:
   (a) selecting a parameter effecting an analog voltage stored in flash memory cells;
   (b) modeling the flash memory cells programming characteristics as responsive to that programming parameter;
   (c) periodically sampling the audio signal, and for each flash memory cell and the respective sample to be stored in that cell;
      (1) applying the programming parameter to the flash memory cell using at least one value in the model selected to under-program the flash memory cell;
      (2) determining the change in the flash memory cell read voltage;
      (3) revising the value(s) in the model to more accurately reflect the actual flash memory cell programming characteristics; and,
      (4) again applying the programming parameter to the flash memory cell using the revised value(s) in the model.

7. The method of claim 6 wherein each flash memory cell is individually programmed within the period of successive samples of the audio signal.

8. The method of claim 7 further comprising repeating (2), (3) and (4) at least once.

9. The method of claim 8 wherein the modeling of the flash memory cell programming characteristics includes at least one value dependent on the amount of flash memory cell programming left to be done.

10. The method of claim 9 wherein one of the at least one value in the model selected to under-program the flash memory cell is the value dependent on the amount of cell programming left to be done.

11. The method of claim 10 wherein the value dependent on the amount of flash memory cell programming left to be done is a value reflecting only a fraction of the amount of flash memory cell programming left to be done when applying the first programming parameter to the flash memory cell, which fraction is increased when repeating (3) and (4).

12. The method of claim 11 wherein the value dependent on the amount of flash memory cell programming left to be done is equal to its full value when repeating (3) and (4) for the last time.

13. A method of programming an analog storage memory cell to provide a cell read voltage in accordance with an analog voltage to be stored in the cell comprising:
   (a) modeling the cell programming characteristics as responsive to a programming voltage pulse;
   (b) applying the programming voltage pulse to the cell using a programming voltage pulse selected to under-program the cell;

(c) determining the change in the cell read voltage;

(d) revising the value(s) in the model to more accurately reflect the actual cell programming characteristics; and, (e) again applying the programming voltage pulse to the cell using the revised value(s) in the model.

14. The method of claim 13 further comprising repeating (c), (d) and (e) at least once.

15. The method of claim 14 wherein the modeling of the cell programming characteristics includes at least one value dependent on the amount of cell programming left to be done.

16. The method of claim 15 wherein one of the at least one value in the model selected to under-program the cell is the value dependent on the amount of cell programming left to be done.

17. The method of claim 16 wherein the value dependent on the amount of cell programming left to be done is a value reflecting only a fraction of the amount of cell programming left to be done when applying the first programming voltage pulse to the cell, which fraction is increased when repeating (c), (d) and (e).

18. A method of storing an audio signal in a plurality of flash memory cells to allow reconstructing the audio signal by reading the analog voltages in each cell and successively concatenating the voltages read from the cells comprising:

(a) modeling the flash memory cells programming characteristics as responsive to a programming voltage pulse;

(b) periodically sampling the audio signal, and for each flash memory cell and the respective sample to be stored in that cell;

(1) applying the programming voltage pulse to the flash memory cell using at least one value in the model selected to under-program the flash memory cell;

(2) determining the change in the flash memory cell read voltage;

(3) revising the value(s) in the model to more accurately reflect the actual flash memory cell programming characteristics; and, (4) again applying the programming voltage pulse to the flash memory cell using the revised value(s) in the model.

19. The method of claim 18 further comprising repeating (2), (3) and (4) at least once.

20. The method of claim 19 wherein each flash memory cell is individually programmed within the period of successive samples of the audio signal.

21. The method of claim 20 wherein the modeling of the flash memory cell programming characteristics includes at least one value dependent on the amount of flash memory cell programming left to be done.

22. The method of claim 21 wherein one of the at least one value in the model selected to under-program the flash memory cell is the value dependent on the amount of cell programming left to be done.

23. The method of claim 22 wherein the value dependent on the amount of flash memory cell programming left to be done is a value reflecting only a fraction of the amount of flash memory cell programming left to be done when applying the first programming voltage pulse to the flash memory cell, which fraction is increased when repeating (2), (3) and (4).

24. The method of claim 23 wherein the value dependent on the amount of flash memory cell programming left to be done is equal to its full value when repeating (3) and (4) for the last time.

25. The method of claim 24 wherein each flash memory cell is individually programmed within the period of successive samples of the audio signal.

* * * * *